United States Patent
Chakravarthy et al.

(12)

(10) Patent No.: US 12,424,414 B2
(45) Date of Patent: Sep. 23, 2025

(54) SEMICONDUCTOR PROCESSING SYSTEM WITH A MANIFOLD FOR EQUAL SPLITTING AND COMMON DIVERT ARCHITECTURE

(71) Applicant: Applied Materials, Inc., Santa Clara, CA (US)

(72) Inventors: Arun Chakravarthy Chakravarthy, Panruti (IN); Vinay K. Prabhakar, Fremont, CA (US); Dharma Ratnam Srichurnam, Hyderabad (IN); Hossein Rezvantalab, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 254 days.

(21) Appl. No.: 17/505,323

(22) Filed: Oct. 19, 2021

(65) Prior Publication Data
US 2023/0124246 A1     Apr. 20, 2023

(51) Int. Cl.
*H01J 37/32*          (2006.01)

(52) U.S. Cl.
CPC .. *H01J 37/32449* (2013.01); *H01J 37/32743* (2013.01); *H01J 37/32899* (2013.01); *H01J 2237/33* (2013.01)

(58) Field of Classification Search
CPC ............. H01J 37/32743; H01J 37/2357; H01J 37/32357; H01J 37/32431; H01J 37/3244;
(Continued)

(56) References Cited

U.S. PATENT DOCUMENTS

| 4,583,492 A | * | 4/1986 | Cowher | ................ C23C 16/507 |
| | | | | 118/50.1 |
| 5,605,179 A | * | 2/1997 | Strong, Jr. | ............... F17C 13/04 |
| | | | | 137/884 |

(Continued)

FOREIGN PATENT DOCUMENTS

| KR | 20150116420 A | 10/2015 |
| TW | 201736634 A | 10/2017 |

OTHER PUBLICATIONS

Application No. PCT/US2022/046658, International Search Report and Written Opinion, Mailed on Feb. 14, 2023, 10 pages.
(Continued)

*Primary Examiner* — Gordon Baldwin
*Assistant Examiner* — Joshua Reyes
(74) *Attorney, Agent, or Firm* — Kilpatrick Townsend & Stockton LLP

(57) ABSTRACT

Exemplary substrate processing systems may include a lid plate. The systems may include a gas splitter seated on the lid plate. The gas splitter may include a top surface and side surfaces. The gas splitter may define a first and second gas inlets, with each gas inlet extending through one side surface. The gas splitter may define first and second gas outlets extending through the top surface. The gas splitter may define first and second gas lumens that extend between and fluidly couple each gas inlet with corresponding gas outlets. The gas splitter may define mixing channels that include a mixing outlet extending through a side surface and a mixing inlet extending through the top surface. The systems may include output manifolds seated on the lid plate. The systems may include output weldments that fluidly couple each mixing outlet with a respective one of the output manifolds.

19 Claims, 9 Drawing Sheets

(58) Field of Classification Search
CPC ........... H01J 37/32449; H01J 37/32522; H01J 37/32633; H01J 37/32853; H01J 37/32871; H01J 37/32889; H01J 37/32899; H01J 2237/002; H01J 2237/33; C23C 16/4405; C23C 16/4408; C23C 16/45512; C23C 16/45561; C23C 16/45563; C23C 16/45565; C23C 16/45574; C23C 16/45576; C23C 16/45587; C23C 16/45593; C23C 16/54; C23C 14/568; H01L 21/6719; H01L 21/6723; H01L 21/67155; H01L 21/67161; H01L 21/67167; H01L 21/67173; H01L 21/67178; H01L 21/67184; H01L 21/67196; H01L 21/67201; H01L 21/67207; H01L 21/67213; H01L 21/67219; H01L 21/67225; H01L 21/67236; H01L 21/68707; H01L 21/68771
See application file for complete search history.

(56) References Cited

U.S. PATENT DOCUMENTS

| | | | |
|---|---|---|---|
| 6,293,310 B1 * | 9/2001 | Redemann | H01J 37/3244 137/884 |
| 6,329,297 B1 * | 12/2001 | Balish | H01J 37/3244 156/345.35 |
| 6,878,206 B2 * | 4/2005 | Tzu | C23C 16/45512 118/728 |
| 8,291,935 B1 * | 10/2012 | Merritt | F16K 27/003 137/897 |
| 2003/0116087 A1 | 6/2003 | Nguyen et al. | |
| 2003/0176074 A1 * | 9/2003 | Paterson | H01J 37/32458 438/709 |
| 2004/0007176 A1 * | 1/2004 | Janakiraman | H01L 21/67754 427/248.1 |
| 2004/0173270 A1 * | 9/2004 | Harris | F16K 27/003 137/884 |
| 2005/0115675 A1 | 6/2005 | Tzu et al. | |
| 2009/0320754 A1 * | 12/2009 | Oya | C23C 16/455 137/861 |
| 2015/0251133 A1 * | 9/2015 | Cox | B01D 53/70 423/210 |
| 2016/0111258 A1 | 4/2016 | Taskar et al. | |
| 2017/0306493 A1 * | 10/2017 | Raj | H01J 37/32449 |
| 2017/0335456 A1 | 11/2017 | Nguyen et al. | |
| 2020/0199753 A1 * | 6/2020 | Hidaka | B01B 1/06 |

OTHER PUBLICATIONS

Application No. KR10-2024-7016065, Office Action, Mailed On Jun. 16, 2025, 4 pages.

* cited by examiner

FIG. 7
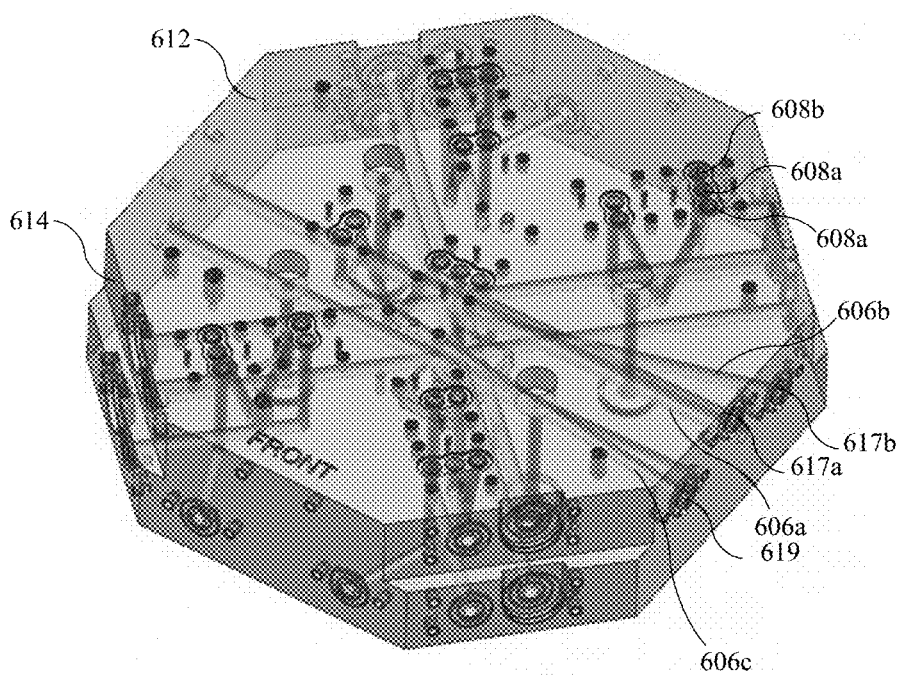
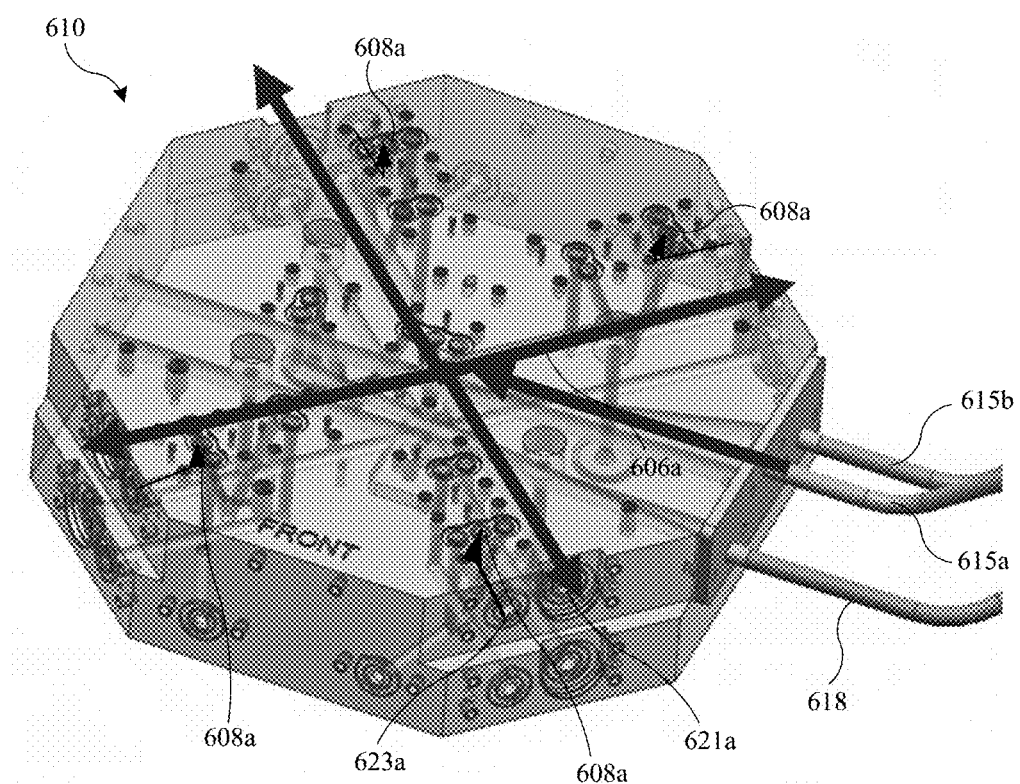
FIG. 7A

FIG. 7B
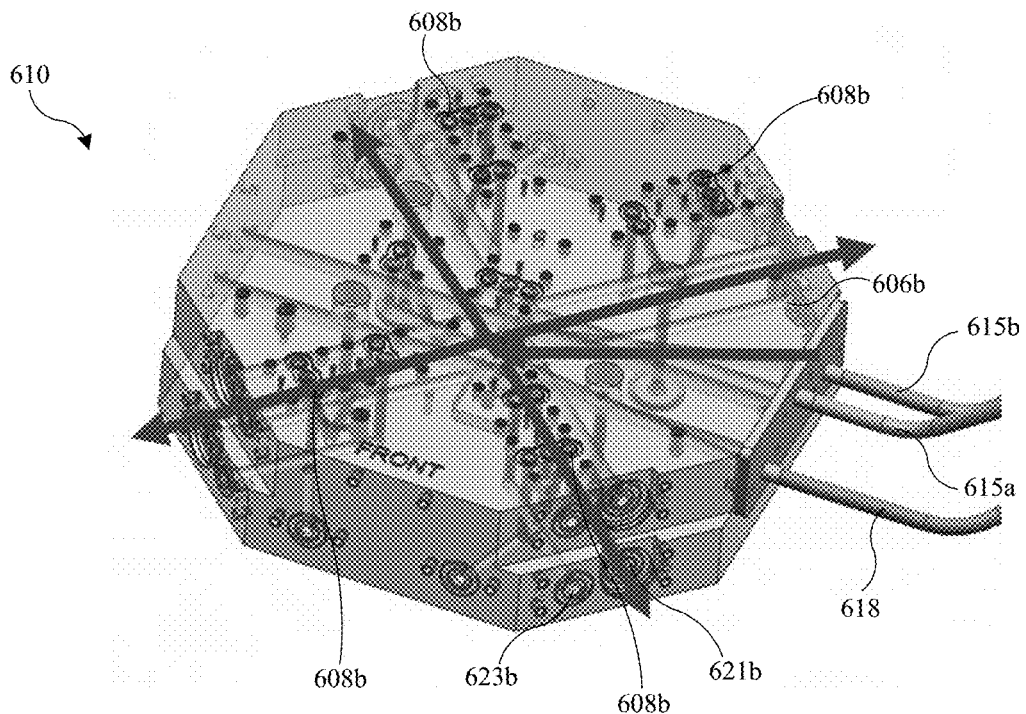
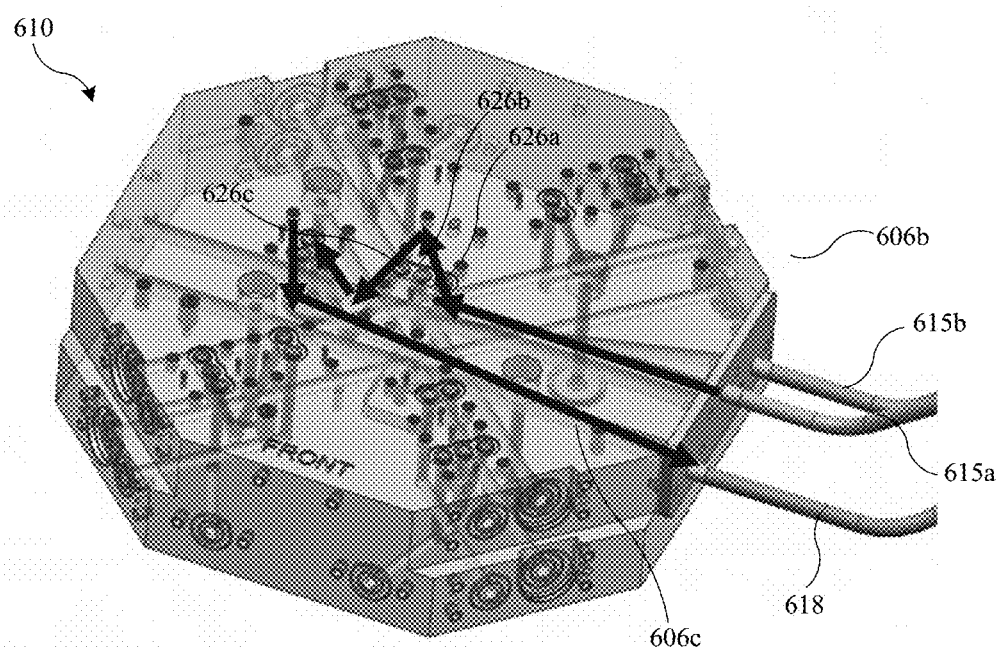
FIG. 7C

SEMICONDUCTOR PROCESSING SYSTEM WITH A MANIFOLD FOR EQUAL SPLITTING AND COMMON DIVERT ARCHITECTURE

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Oftentimes, processing systems include gas distribution systems that may mix and/or otherwise deliver a number of process gases to the various chambers. The flow of these gases may be carefully controlled to ensure uniform flow of gases into each of the processing chambers. Additionally, the gases may need to be maintained at certain temperatures during the gas delivery process.

Thus, there is a need for improved systems and methods that can be used to efficiently mix and/or otherwise deliver gases to processing chambers under desired conditions. These and other needs are addressed by the present technology.

SUMMARY

Exemplary substrate processing systems may include a lid plate. The systems may include a gas splitter seated on the lid plate. The gas splitter may include a top surface and a plurality of side surfaces. The gas splitter may define a first gas inlet and a second gas inlet, with each of the first gas inlet and the second gas inlet extending through at least one of the plurality of side surfaces. The gas splitter may define a plurality of first gas outlets. Each first gas outlet may extend through the top surface. The gas splitter may define a plurality of second gas outlets. Each second gas outlet may extend through the top surface at a location proximate a respective one of the plurality of first gas outlets. The gas splitter may define a plurality of first gas lumens that extend between and fluidly couple the first gas inlet with each of the plurality of first gas outlets. The gas splitter may define a plurality of second gas lumens that extend between a fluidly couple the second gas inlet with each of the plurality of second gas outlets. The gas splitter may define a plurality of mixing channels. Each mixing channel may include a mixing outlet extending through one of the plurality of side surfaces and a mixing inlet extending through the top surface and being at a location proximate the first gas outlet and the second gas outlet. The systems may include a plurality of output manifolds seated on the lid plate. The systems may include a plurality of output weldments. Each output weldment may fluidly couple a respective one of the mixing outlets with a respective one of the output manifolds.

In some embodiments, the gas splitter may define a divert lumen that is fluidly coupled with the first gas lumen and that directs gases away from a processing chamber through a divert outlet. The systems may include a plurality of mixing valves. Each of the mixing valves may be coupled with a respective one of the first gas outlets, a respective one of the second gas outlets, and a respective one of the mixing inlets. The systems may include a plurality of first orifice holders. Each of the first orifice holders may be coupled with a respective side surface of the gas splitter. Each of the first orifice holders may define a first intermediate gas lumen that fluidly couples a first segment of a respective one of the first gas lumens with a second segment of the respective one of the first gas lumens. The systems may include a plurality of second orifice holders. Each of the second orifice holders may be coupled with a respective side surface of the gas splitter. Each of the second orifice holders may define a second intermediate gas lumen that fluidly couples a first segment of a respective one of the second gas lumens with a second segment of the respective one of the second gas lumens A first interface between each of the first intermediate fluid lumens and the respective one of the first fluid lumens may include a first choke having a diameter that is less than a diameter of the first intermediate fluid lumen and the first fluid lumen. A second interface between each of the second intermediate fluid lumens and the respective one of the second fluid lumens may include a second choke having a diameter that is less than a diameter of the second intermediate fluid lumen and the second fluid lumen. The systems may include a plurality of input weldments that fluidly couple a plurality of gas sources with the gas inputs of the gas splitter. The gas splitter may include a heat source. The systems may include a remote plasma unit supported above the gas splitter. The remote plasma unit may be fluidly coupled with each of the plurality of output manifolds. The systems may include a center manifold coupled with an outlet of the remote plasma unit. The systems may include a plurality of side manifolds that are each fluidly coupled with one of a plurality of outlet ports of the center manifold. Each of the plurality of side manifolds may define a gas lumen that is fluidly coupled with one of the plurality of output manifolds. The systems may include a plurality of processing chambers positioned below the lid plate. Each processing chamber may define a processing region that is fluidly coupled with one of the plurality of output manifolds.

Some embodiments of the present technology may encompass semiconductor processing system. The systems may include a gas splitter having a top surface and a plurality of side surfaces. The gas splitter may define a first gas inlet and a second gas inlet, with each of the first gas inlet and the second gas inlet extending through at least one of the plurality of side surfaces. The gas splitter may define a plurality of first gas outlets. Each first gas outlet may extend through the top surface. The gas splitter may define a plurality of second gas outlets. Each second gas outlet may extend through the top surface at a location proximate a respective one of the plurality of first gas outlets. The gas splitter may define a plurality of first gas lumens that extend between and fluidly couple the first gas inlet with each of the plurality of first gas outlets. The gas splitter may define a plurality of second gas lumens that extend between a fluidly couple the second gas inlet with each of the plurality of second gas outlets. The gas splitter may define a plurality of mixing channels. Each mixing channel may include a mixing outlet extending through one of the plurality of side surfaces and a mixing inlet extending through the top surface and being at a location proximate the first gas outlet and the second gas outlet.

In some embodiments, the systems may include a plurality of output manifolds. The systems may include a plurality of output weldments. Each output weldment may fluidly couple a mixing outlet of one of the gas lumens with a respective one of the output manifolds. The systems may include a remote plasma unit supported above the gas splitter. The remote plasma unit may be fluidly coupled with each of the plurality of output manifolds. The systems may include a plurality of isolation valves. Each of the plurality of isolation valves may be fluidly coupled between the remote plasma unit and one of the plurality of output manifolds. The systems may include a lid plate that supports each of the plurality of output manifolds. The systems may include a plurality of processing chambers positioned below the lid plate. Each processing chamber may define a processing region that is fluidly coupled with one of the plurality of output manifolds. The systems may include a first input weldment that fluidly couples a first gas source with the first gas inlet of the gas splitter. The systems may include a second input weldment that fluidly couples a second gas source with the second gas inlet of the gas splitter. The systems may include a plurality of mixing valves. Each of the mixing valves may be coupled with a respective one of the first gas outlets, a respective one of the second gas outlets, and a respective one of the mixing inlets. The gas splitter may define a divert lumen that is fluidly coupled with the first gas lumen and that directs gases away from a processing chamber through a divert outlet. The systems may include a plurality of first orifice holders. Each of the first orifice holders may be coupled with a respective side surface of the gas splitter. Each of the first orifice holders may define a first intermediate gas lumen that fluidly couples a first segment of a respective one of the first gas lumens with a second segment of the respective one of the first gas lumens. The systems may include a plurality of second orifice holders. Each of the second orifice holders may be coupled with a respective side surface of the gas splitter. Each of the second orifice holders may define a second intermediate gas lumen that fluidly couples a first segment of a respective one of the second gas lumens with a second segment of the respective one of the second gas lumens. A first interface between each of the first intermediate fluid lumens and the respective one of the first fluid lumens may include a first choke having a diameter that is less than a diameter of the first intermediate fluid lumen and the first fluid lumen. A second interface between each of the second intermediate fluid lumens and the respective one of the second fluid lumens may include a second choke having a diameter that is less than a diameter of the second intermediate fluid lumen and the second fluid lumen.

Some embodiments of the present technology may encompass semiconductor processing systems. The systems may include a plurality of processing chambers. Each processing chamber may define a processing region. The systems may include a lid plate positioned above the plurality of processing chambers. The systems may include a plurality of output manifolds seated on the lid plate. Each of the plurality of output manifolds may be in fluid communication with the processing region of one of the plurality of processing chambers. The systems may include a gas splitter seated on the lid plate. The gas splitter may include a top surface and a plurality of side surfaces. The gas splitter may define a first gas inlet and a second gas inlet, with each of the first gas inlet and the second gas inlet extending through at least one of the plurality of side surfaces. The gas splitter may define a plurality of first gas outlets. Each first gas outlet may extend through the top surface. The gas splitter may define a plurality of second gas outlets. Each second gas outlet may extend through the top surface at a location proximate a respective one of the plurality of first gas outlets. The gas splitter may define a plurality of first gas lumens that extend between and fluidly couple the first gas inlet with each of the plurality of first gas outlets. The gas splitter may define a plurality of second gas lumens that extend between a fluidly couple the second gas inlet with each of the plurality of second gas outlets. The gas splitter may define a plurality of mixing channels. Each mixing channel may include a mixing outlet extending through one of the plurality of side surfaces and a mixing inlet extending through the top surface and being at a location proximate the first gas outlet and the second gas outlet. The systems may include a plurality of weldments. Each weldment may fluidly couple a respective one of the mixing outlets with a respective one of the output manifolds.

Such technology may provide numerous benefits over conventional systems and techniques. For example, the processing systems may provide multi-substrate processing capabilities that may be scaled well beyond conventional designs. Additionally, the processing systems may provide equal flow splitting between multiple chambers, while preventing cross-talk between the chambers. The processing systems may also provide the ability to tune deposition rates using divert flow paths. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 7 shows a schematic top isometric view of an exemplary gas splitter according to some embodiments of the present technology.

FIGS. 7A-7C illustrate various flow paths through the gas splitter of FIG. 7.

Figure 1:
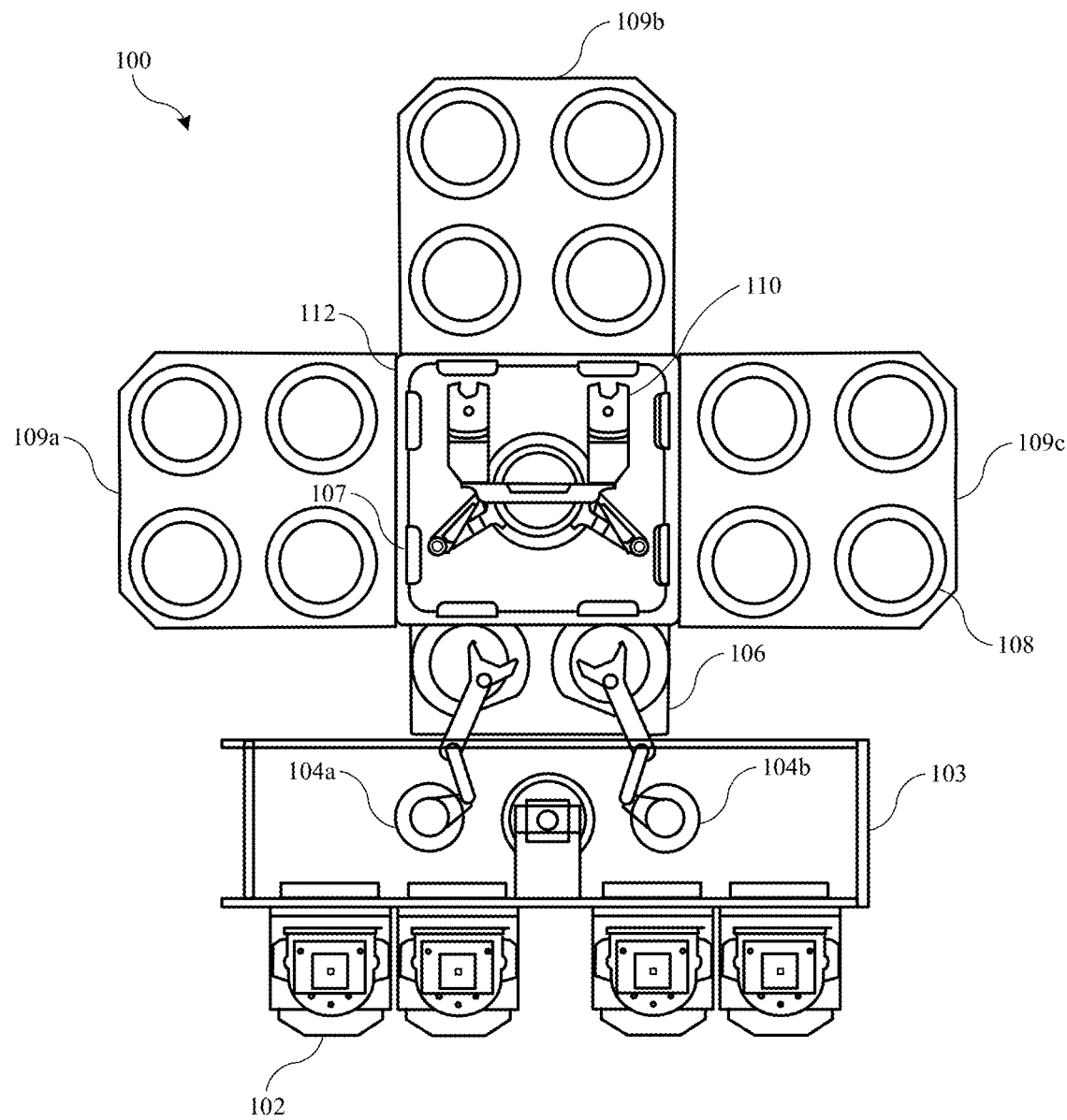
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

Additionally, the use of a single gas source to deliver process gases to a number of chambers creates the possibility of uneven gas flow between the chambers and crosstalk between the chambers. The present technology overcomes these issues by incorporating passive flow control devices that ensure flow from the gas source is equal between each chamber. Embodiments may further increase flow conductance along a gas divert path and provide more efficient heating mechanisms to gas delivery assemblies. Additionally, the present technology may incorporate isolation valves that prevent cross-talk between chambers, as well as that prevent backstreaming into a remote plasma unit.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement.

In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
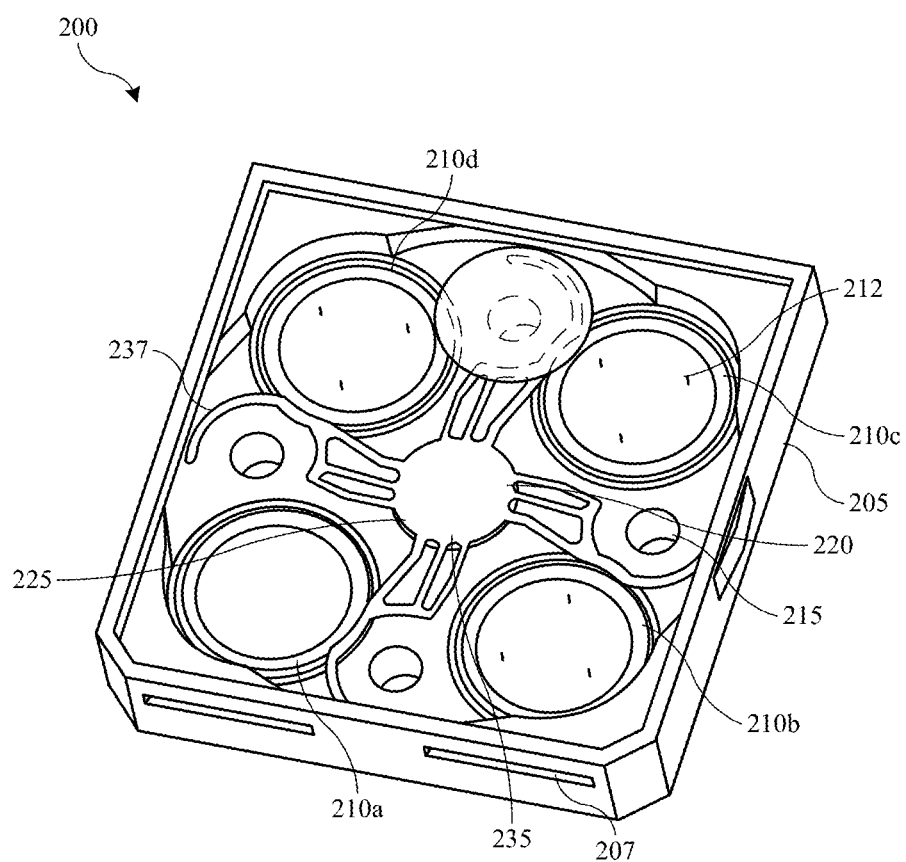
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
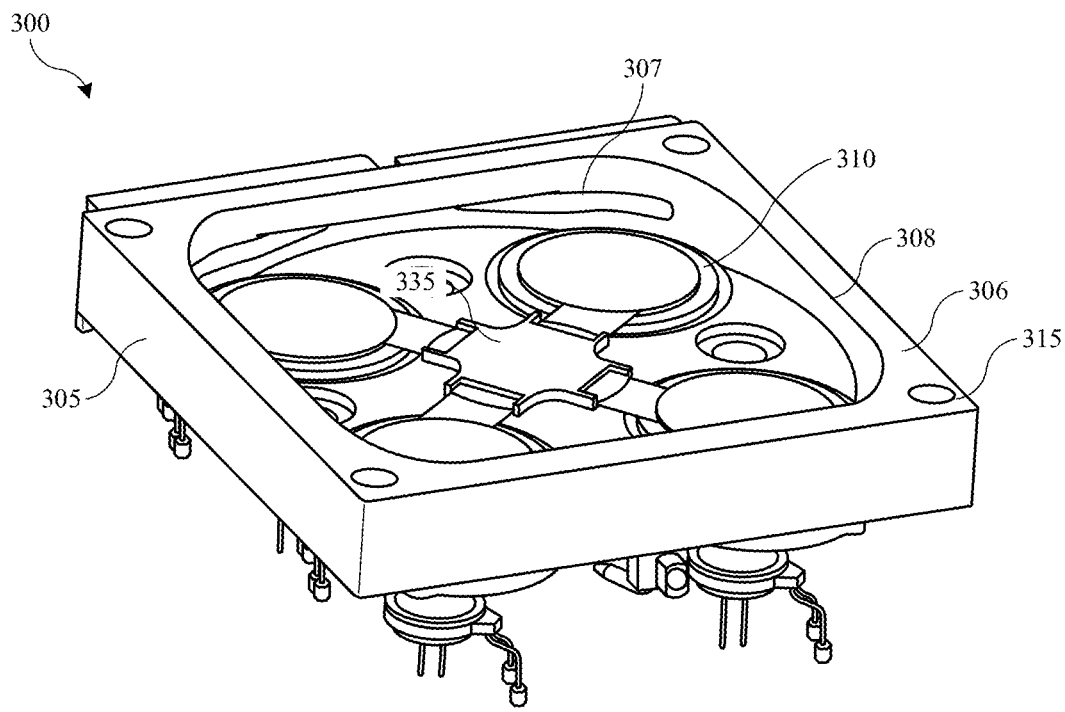
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
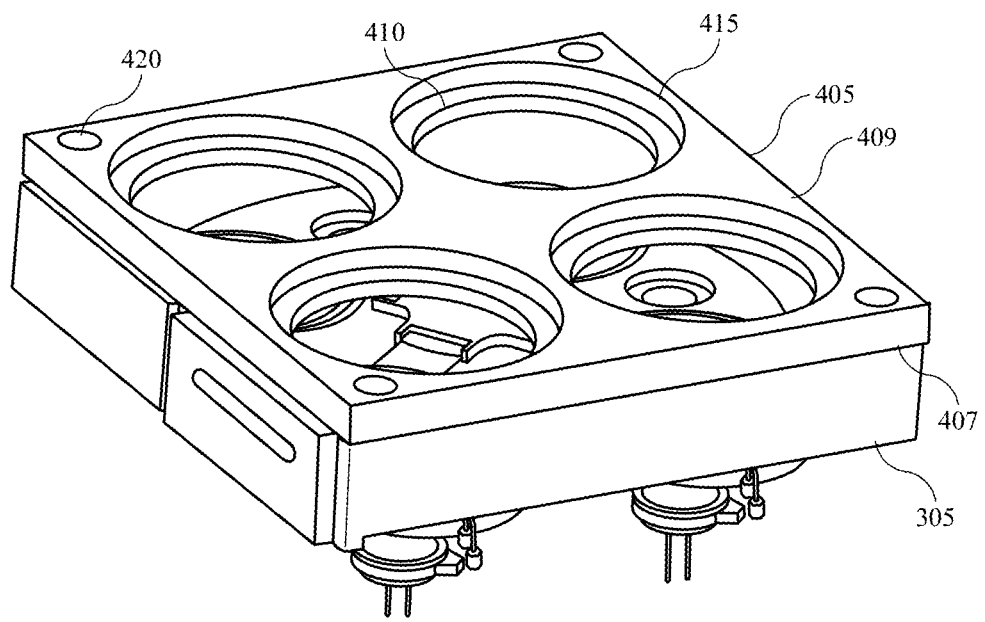
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
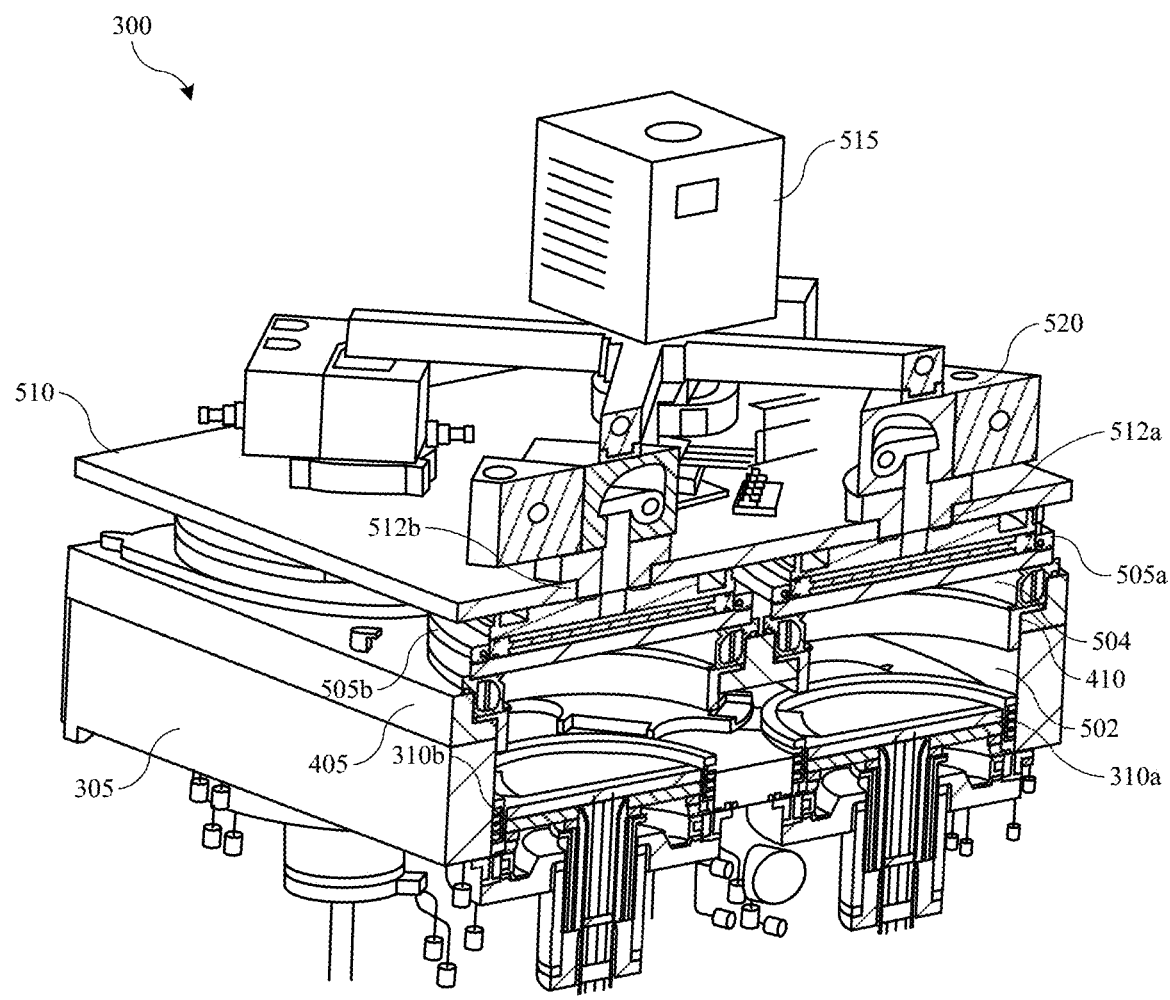
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505a may be aligned over substrate support 310a, and lid stack 505b may be aligned over substrate support 310b. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512a may provide fluid access to lid stack 505a. Aperture 512a may also be axially aligned with any of the lid stack components, as well as with substrate support 310a in some embodiments, which may produce an axial alignment for each of the components associated with individual processing regions, such as along a central axis through the substrate support or any of the components associated with a particular processing region 504. Similarly, aperture 512b may provide fluid access to lid stack 505b, and may be aligned, including axially aligned with components of the lid stack as well as substrate support 310b in some embodiments.

Figure 6:
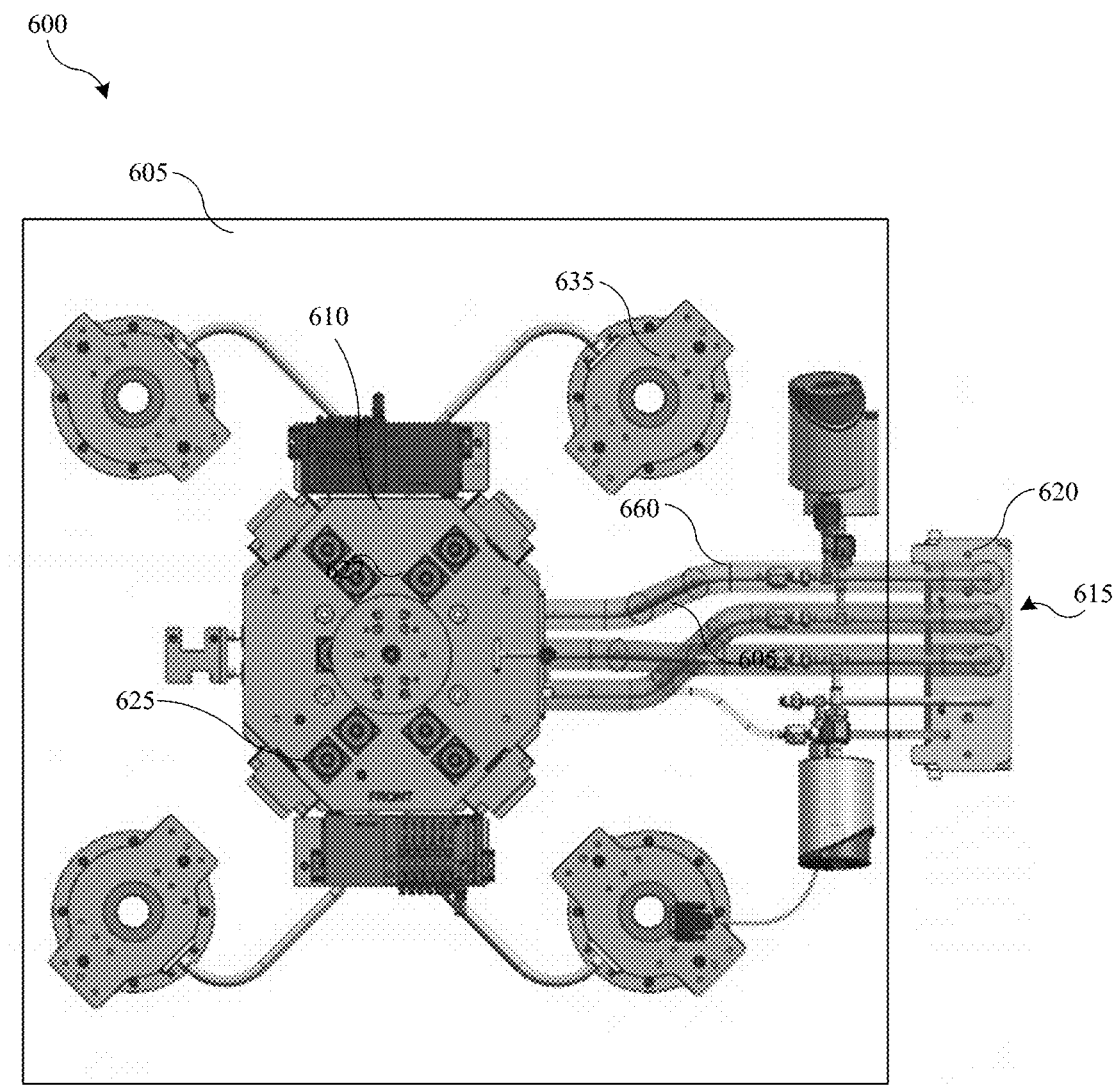
FIG. 6 shows a schematic top plan view of an exemplary processing system according to some embodiments of the present technology.

FIG. 6 shows a schematic top plan view of one embodiment of semiconductor processing system 600 according to some embodiments of the present technology. The figure may include components of any of the systems illustrated and described previously, and may also show further aspects of any of the previously described systems. It is to be understood that the illustration may also show exemplary components as would be seen on any quad section 109 described above.

Semiconductor processing system 600 may include a lid plate 605, which may be similar to second lid plate 510 previously described. For example, the lid plate 605 may define a number of apertures, similar to apertures 512, which provide access to a number of processing chambers positioned beneath the lid plate 605. Each aperture of the plurality of apertures may be defined to provide fluid access to a specific lid stack, processing chamber, and/or processing region.

A gas splitter 610 may be seated on a top surface of the lid plate 605. For example, the gas splitter 610 may be centered between the apertures of the lid plate 605. In some embodiments, one or more polymer and/or other insulative spacers, such as PEEK spacers, may be provided between a bottom surface of the gas splitter 610 and the lid plate 605. The spacers may help reduce heat transfer between the gas splitter 610 and the lid plate 605, which may help improve process conditions and/or reduce power consumption of system 600 (such as by reducing the amount of power needed to heat the gas splitter 610). The gas splitter 610 may be fluidly coupled with a number of input weldments 615 that deliver gases, such as precursors, plasma effluents, and/or purge gases from a number of gas sources to the gas splitter 610. For example, each of the input weldments 615 may extend vertically from gas sources positioned below the lid plate 605 and pass through a feedthrough plate 620. A portion of the input weldments 615 above the feedthrough plate 620 may be bent horizontally and may direct the gases toward the gas splitter 610. In some embodiments, some or all of the input weldments 615 may be disposed within heater jackets 660 that help prevent heat loss along the length of the input weldments 615.

As will be discussed further below, the gas splitter 610 may receive gases from the input weldments 615 and may recursively split the gas flows into a greater number of gas outputs that are each interfaced with a respective one of a number of mixing valves 625. The mixing valves 625 may mix and/or control the flow of multiple types of gases passing through the gas splitter 610 and into one or more of the processing chambers. For example, actuation of the mixing valves 625 at each location may control whether purge and/or process gases are mixed and/or flowed to a respective processing chamber or are diverted away from the processing chamber to another location of the system 600. For example, mixing outlets of the gas splitter 610 may each be fluidly coupled with an output weldment 630, which may deliver the purge gas and/or process gas to an output manifold 635 associated with a particular processing chamber. For example, an output manifold 635 may be positioned over each aperture formed within the lid plate 605 and may be fluidly coupled with the lid stack components to deliver one or more gases to a processing region of a respective processing chamber.

FIG. 7 shows a schematic isometric view of the gas splitter 610. Gas splitter 610 may include a body having a top surface 612 and a number of side surfaces 614. In some embodiments, the gas splitter 610 may be a monolithic structure, with any lumens and/or other apertures machined into the structure. Such a design may eliminate the need for ebeam welding and/or other joining techniques that may present opportunities for gas leakage and/or uniformity issues. As illustrated, the gas splitter 610 is octagonal in shape and has eight side surfaces 614, however other numbers of side surfaces 614 may be utilized in various embodiments to meet the needs of a particular application. As just one example, a number of side surfaces may be reduced for systems with fewer than four processing chambers and may be increased for systems with more than four processing chambers. Gas splitter 610 may be interfaced with a number of input weldments 615 (as best shown in FIG. 7A). Each of the input weldments 615 may define a gas channel formed between an inlet and an outlet. Outlets of each of the input weldments 615 may be coupled with a respective gas inlet of the gas splitter 610, which may enable gas to be flowed from each gas source through the input weldments 615 and into the gas splitter 610. For example, the system 600 may include a first input weldment 615a that is coupled with a first gas inlet 617a of the gas splitter 610 and a second input weldment 615b that is coupled with a first gas inlet 617b of the gas splitter. In some embodiments, the gas inlets 617 may each extend through one of the side surfaces 614 of the gas splitter 610. For example, as illustrated, each of the gas inlets 617 extends through a same side surface 614, although in other embodiments one or more gas inlets 617 may extend through a different side surface 614 than at least one other gas inlet 617. By positioning the gas inlets 617 through a side surface 614 of the gas splitter 610, the input weldments 615 may have fewer or no bends that may cause flow uniformity issues. In some embodiments, each input weldment 615 may have a single inlet and single outlet, which may further improve flow uniformity through the input weldment 615 (and subsequently system 600) as a single flow path may be more easily machined or otherwise formed to tight tolerances. However, some embodiments may utilize one or more input weldments that split from one inlet to one or more outlets. As just one example, the first input weldment 615a may deliver a deposition gas, such as, but not limited to, tetraethyl orthosilicate ("TEOS") or any other silicon-containing precursor, to a gas inlet 617a of the gas splitter 610. The second input weldment 615b may deliver an oxygen-containing precursor, such as diatomic oxygen, ozone, and/or nitrogen-containing precursors that incorporate oxygen, water, alcohol, or other materials to a gas inlet 617b of the gas splitter 610. In some embodiments, one or more divert weldments 618 may be coupled with the gas splitter 610 to direct gases away from the processing chambers and the gas splitter 610, such as to external gas containers. Such an arrangement may enable up to three different chemistries to be delivered to a processing chamber (e.g., gas from just first input weldment 615a, gas from just second input weldment 615b, or gas from both the first input weldment 615a and the second input weldment 615b). As illustrated, divert weldment 618 may couple with a divert outlet 619 of the gas splitter 610. Divert outlet 619 may be fluidly coupleable with the first gas inlet 917a to divert excess deposition (or other) gases from the gas splitter 610. Gas flow through each of these branches joins and is flowed away from the gas splitter 610. It will be understood that other arrangements of weldments/gas inlets are possible, including arrangements that include more or fewer weldments/inlets, with greater number of weldments/inlets enabling greater numbers of chemistries of gases to be delivered to the processing chambers with a single weldment arrangement.

The gas splitter 610 may define a number of gas lumens 606 that extend between and fluidly couple the gas inlets 617 of the gas splitter 610 with gas outlets 608 of the gas splitter 610. At least some of the gas channels 606 may split gas flow from a single gas inlet to multiple gas outlets 608 such that the gas splitter 610 includes a greater number of gas outlets 608 than gas inlets. As illustrated, four first gas lumens 606a are fluidly coupled with the first gas inlet 617a and extend radially outward from the center of the gas splitter 610 to split flow from the first input weldment 615a to deliver gas to four (or other number based on a number of processing chambers included in system 600) different first gas outlets 608a. In some embodiments, each of the first gas outlets 608a may extend through the top surface 612 of the gas splitter 610. Each of the gas outlets 608a may be positioned on a different side/area of the gas splitter 610. The split arrangement of first gas lumens 606a may single gas source to provide equal flow rates of gas through each of the four gas outlets 608a using a single input weldment 615 (with a single outlet) and single gas splitter 610. Four second gas lumens 606b may be fluidly coupled with the second gas inlet 617b. Each second gas lumen 606b may deliver gas to a different one of four (or other number based on a number of processing chambers included in system 600) second gas outlets 608b, with each of the second gas outlets 608b being positioned on a different side/area of the gas splitter 610 and being proximate to a respective one of the first gas outlets 608a. In some embodiments, each of the second gas inlets 608b may extend through the top surface 612 of the gas splitter 610. In some embodiments, the first gas inlet 617a and first gas lumens 606a may be vertically tiered relative to the second gas inlet 617b and second gas lumens 606b. This may enable the first gas lumens 606a and second gas lumens 606b to direct gases to similar locations of the gas splitter 610 without the first gas lumens 606a and second gas lumens 606b intersecting one another. In embodiments using more than two gases, additional tiers of gas lumens may be provided to direct flow of the additional gas(es) without the additional lumens intersecting first or second gas lumens 606.

A divert gas lumen 606c may couple with the divert weldment 618 and may include a divert inlet 624 that may be proximate a port of the first gas lumen 606a such that the divert gas lumen 606c may be fluidly coupled with the first gas lumen 606a to divert excess amounts of a first gas away from the process chambers. It is to be understood that the arrangement of gas inlets 617, gas outlets 608, and gas lumens 606 is merely representative of a single embodiment of a gas splitter 610 and that numerous variations in placement and orientation of the gas inlets 617, gas outlets 608, and/or gas lumens 606 is possible. Additionally, gas lumens 606 may be arranged to provide any number of flow paths, including single flow paths, from a given gas inlet 617. Gas splitter 610 may be designed to accommodate any number of input weldments from various gas sources, allowing the number of chemistries enabled by the gas splitter to be scaled to meet the demands of a particular processing operation.

FIG. 7A illustrates a first portion of a flow path of gas through the first gas lumen 606a according to one embodiment of the present technology. A first gas may enter the gas splitter 610 via the first gas inlet 617a and may be directed to a center of the gas splitter 610. The gas may then be split into a number (here four) of different branches of first gas lumen 606a, which may each be directed to a different side of the gas splitter 610 where the first gas may temporarily exit the gas splitter 610 via a first gas exit port 621a. As will be discussed in greater detail below, upon exiting the gas splitter 610 via first gas exit port 621a, the first gas may be redirected back into the gas splitter 610 at a first gas entry port 623a using an orifice holder (not shown). The first gas lumen 606a may then turn upward and direct the first gas through one of the first gas outlets 608a formed in the top surface 612 of the gas splitter 610. Such a configuration and may simplify machining of the gas splitter 610 when formed as a monolithic structure.

FIG. 7B shows a first portion of a flow path of gas through the second gas lumen 606b according to some embodiments of the present technology. A second gas may enter the gas splitter 610 via the second gas inlet 617b and may be directed to a center of the gas splitter 610. The gas may then be split into a number (here four) of different branches of second gas lumen 606b, which may each be directed to a different side of the gas splitter 610, where the second gas may temporarily exit the gas splitter 610 via a second gas exit port 621b. As will be discussed in greater detail below, upon exiting the gas splitter 610 via second gas exit port 621b, the second gas may be redirected back into the gas splitter 610 at a second gas entry port 623b using an orifice holder (not shown). The second gas lumen 606b may then turn upward and direct the second gas through one of the second gas outlets 608b formed in the top surface 612 of the gas splitter 610.

FIG. 7C shows a flow path of diverted gas exiting the gas splitter 610 via the divert gas lumen 606c. As shown, first gas may enter the gas splitter 610 via the first gas inlet 617a. Prior to splitting into a number of branches of first gas lumen 606a, the first gas may pass through a valve port 626a and into a valve (not shown) coupled with the top surface 612 of the gas splitter 610. If the first gas is to be flowed into the processing chambers, the valve may direct the first gas into a valve port 626b, where the first gas may be passed into the branches of first gas lumens 606a as discussed above. If the first gas is to be diverted, the valve may direct the first gas into valve port 626c and directed into the divert gas lumen 606c for removal from the system 600 via the divert weldment 618.

Figure 8:
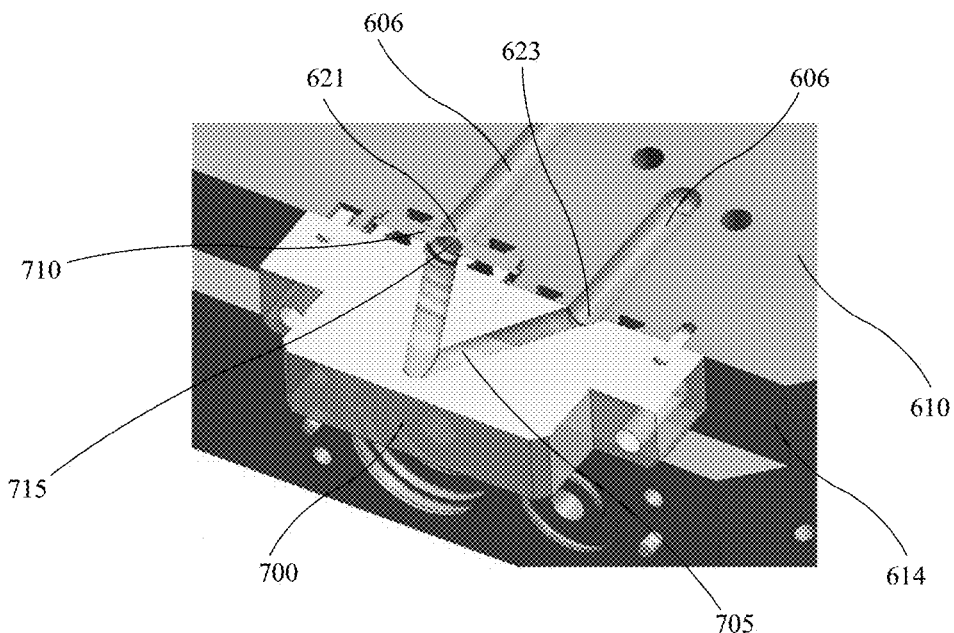
FIG. 8 shows a partial schematic isometric view of an orifice holder coupled with the gas splitter of FIG. 7 according to some embodiments of the present technology.

As noted above, some or all of the gas lumens 606 may be formed in multiple segments, with additional components being used to couple the various segments of such gas lumens 606. FIG. 8 illustrates an orifice holder 700 coupled with a side surface 614 of gas splitter 610 to join multiple segments of gas lumens 606. While FIG. 8 illustrates only a single orifice holder 700 at a single interface location of gas splitter 610, it will be appreciated that similar connections between gas splitter 610 and other orifice holders 700 may be utilized at each other interface location. Orifice holder 700 may provide two primary functions: 1) to redirect gas flow from a gas exit port 621 into a gas entry port 623 to simplify machining of the gas splitter 610 and 2) to provide a choke that has a reduced aperture size to serve as a passive flow control device that enables downstream components (including output weldments, manifolds, lid stacks, etc.) to be modified or replaced without the need for any further flow rate tuning. An orifice holder 700 may be provided for each set of gas entry ports 623 and gas exit ports 621 on gas splitter 610 (such as for each first gas lumen 606a and each second gas lumen 606b). As illustrated, each orifice holder 700 defines an intermediate gas lumen 705 that fluidly couples a first segment of a gas lumen 606 (such as a segment extending from the center of gas splitter 610 and/or from gas inlet 617 to a gas exit port 621) with a second segment of a gas lumen 606 (such as a segment extending from a gas inlet port 623 to a gas outlet 608).

An entry and/or exit side of each orifice holder 700 may include a choke positioned at an interface of the orifice holder 700 and the side surface 614 of the gas splitter 610. For example, an opening of each gas exit port 621 of the gas splitter 610 and/or an opening of each gas entry port 623 of the gas splitter 610 may include a choke. The choke may be in the form of a choke plate 710 that defines an central orifice 715 having a reduced diameter relative to the gas lumens 606 and/or intermediate gas channel 705. The choke plate 710 may be received and secured within a slot formed at the interface between the orifice holder 700 and gas splitter 610. In some embodiments, one or more O-rings may be used to seal the interface to prevent any gases flowing through the choke plate 710 from leaking out of the interface. As noted above, the choke plate 710 may define central orifice 715, which may have a diameter that is smaller than diameters of the gas lumens 606 and intermediate gas lumen 705. The diameter of the central orifice 715 provided at first gas lumen 606a and second gas lumen 606b may be the same or different in various embodiments. As illustrated, an upstream side of the central orifice 715 may have a smaller diameter than a downstream side of the central orifice 715. For example, a diameter of the central orifice 715 may taper and/or abruptly increase in diameter from the upstream side of the choke plate 710 to the downstream side. In other embodiments, the central orifice 715 may have a constant diameter across a thickness of the choke plate 710. The reduced diameter of the central orifice 715 relative to the diameters of gas lumens 606 and intermediate gas lumens 705 enables the central orifice 715 to serve as a passive flow control device that enables downstream components (including output weldments, manifolds, lid stacks, etc.) to be modified or replaced without the need for any further flow rate tuning. Such modifications may be made without further flow rate tuning as long as the pressure upstream of the choke plates 710 stays the same at each interface of the gas splitter 610 and the orifice holder 700, which may be achieved by maintaining the same sizes of central orifice 715 at each interface location. The choke point provided by the central orifice 715 ensures that the flow rate through the central orifice 715 is a function of only upstream pressure, as an amount of gas flowing through the choke point depends only on pressure upstream of the central orifices 715. By including flow chokes only along the first and second gas lumens, the divert lumen 606c and flow path may be free of any flow chokes, which may help increase flow conductance through the divert lumen 606c and divert weldment 618.

Figure 9:
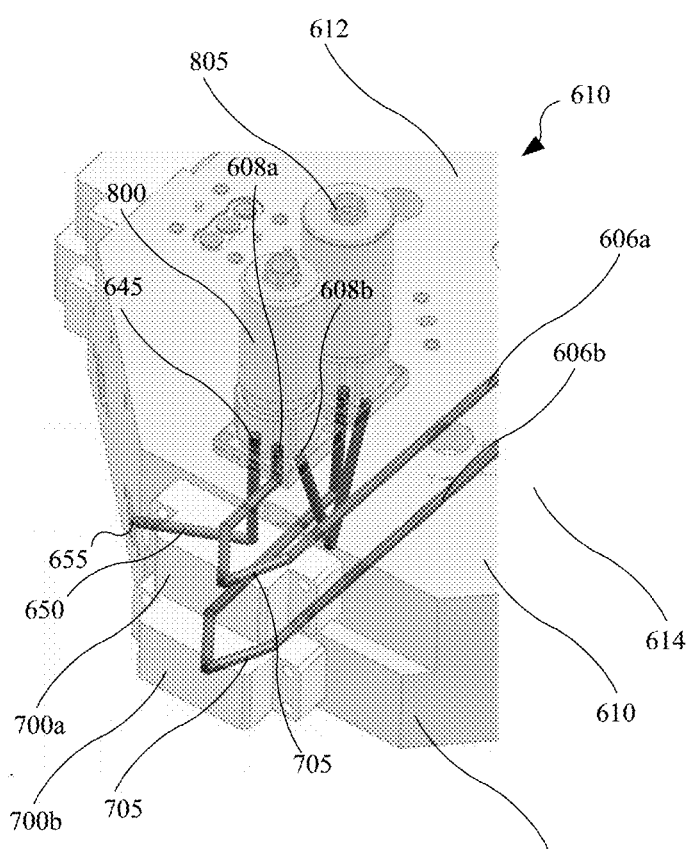
FIG. 9 shows a mixing flow path within the gas splitter of FIG. 7 according to some embodiments of the present technology.

As indicated above, additional components may be used to couple the various segments of gas lumens 606. FIG. 9 illustrates a partial schematic isometric view of a number of valves interfaced with gas splitter 610. FIG. 9 illustrates flow paths for mixing and/or directing the flow of the first gas and second gas out of the gas splitter 610 for delivery to one or more processing chambers. As illustrated, first gas lumen 606a may be fluidly coupled with first gas outlet 608a via a first orifice holder 700a. First gas outlet 608a may be coupled with an inlet of a mixing valve 800, which may control flow of the first gas through a mixing inlet 645 of a mixing channel 650. Mixing inlet 645 may extend through the top surface 612 of gas splitter 610 and may be at a location proximate the first gas outlet 608a and the second gas outlet 608b. Second gas lumen 606b may be fluidly coupled with second gas outlet 608b via a second orifice holder 700b and a valve 805. For example, after flowing back into the gas splitter 610 via second gas entry port 623b, the second gas may be flowed through valve 805, which may control the flow of the second gas through the second gas outlet 608b. Second gas outlet 608b may be coupled with an inlet of mixing valve 800, which may control flow of the second gas through mixing inlet 645 of mixing channel 650. Mixing valve 800 may control whether one or both of the first gas and the second gas are mixed and/or flowed out of the gas splitter 610 for delivery to one or more processing chambers. Gases flowed through the mixing channel 650 may exit the gas splitter 610 via mixing outlets 655, which may each extend through one of the side surfaces 612 of the gas splitter 610. In some embodiments, the second gas outlet 608b may be upstream of first gas outlet 608a, which may help prevent backstreaming of the first gas. For example, the second gas may be delivered at a higher flow rate than the first gas. By being upstream, the higher flow rate of the second gas may help prevent the first gas from flowing in an upstream direction when the mixing valve 800 is open. It will be appreciated that in other embodiments the first gas outlet 608a may be upstream of the second gas outlet 608b.

Figure 10:
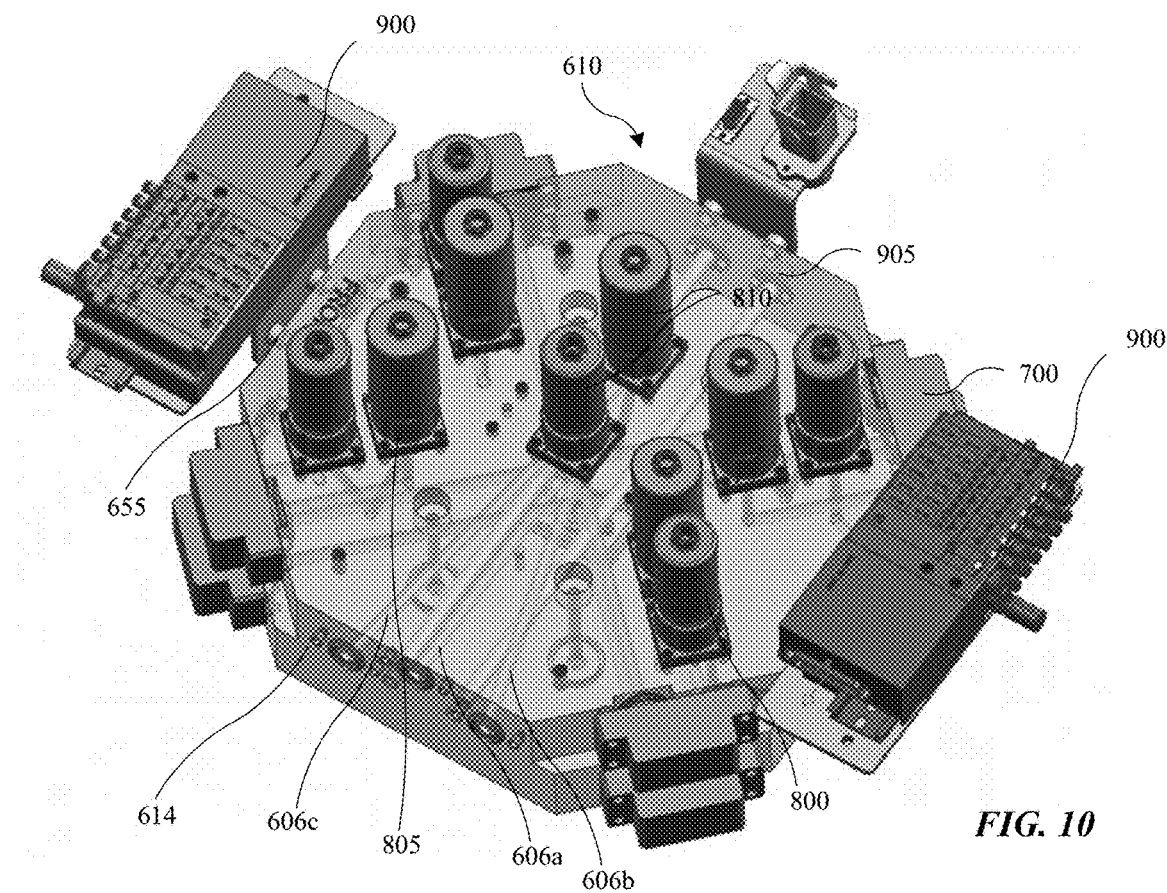
FIG. 10 shows a schematic isometric view of a number of peripheral components coupled with the gas splitter of FIG. 7 according to some embodiments of the present technology.

FIG. 10 illustrates an isometric view of gas splitter 610 with various peripheral components according to embodiments of the present invention. A number of orifice holders 700 may be coupled with gas exit ports and gas inlet ports of the gas splitter 610. A mixing valve 800 may be positioned proximate and coupled with each pair of first and second gas outlets, with a valve 805 coupled proximate each mixing valve 805 to control flow of the second gas through a second gas outlet. Additional valves 810 may be coupled with the first gas lumen 606a and the divert gas lumen 606c to control whether the first gas flows through the first gas lumen 606a or the divert gas lumen 606c. Mixing outlets 655 are provided on side surfaces 614 of the gas splitter 610, and may be coupled with output weldments (not shown) that may deliver one or more gases exiting the gas splitter 610 to one or more output manifolds and/or processing chambers. Valve control manifolds 900 may be provided that control actuation of the various valves in system 600.

In some embodiments, gas splitter 610 may include one or more heat sources. For example, heater cartridges 905 may be coupled with and/or embedded within a body of the gas splitter 610. In some embodiments, the heat cartridges 905 may be positioned proximate the gas lumens 606 to uniformly heat the gases flowing through the gas splitter 610. As illustrated, a respective heat cartridge 905 is disposed between an inlet portion of the first gas lumen 606a and an inlet portion of the second gas lumen 606b and between the inlet portion of the first gas lumen 606a and an outlet portion of the divert gas lumen 606c. By providing a heat source within the gas splitter 610, greater temperature control may be afforded to the system 600, which may improve the quality and uniformity of film deposition operations. Additionally, such a design enables only a single component to be heated to maintain the gases at a desired temperature. The heat source may heat the gas splitter 610 to temperatures of about or greater than 75° C., about or greater than 100° C., about or greater than 125° C., about or greater than 150° C., about or greater than 175° C., about or greater than 200° C., or more.

O-rings or gaskets may be seated between each component of the system 600. In particular, O-rings or gaskets may be seated between couplings of various gas lines, which may help seal the component connections and prevent gas leakage in some embodiments.

Figure 11:
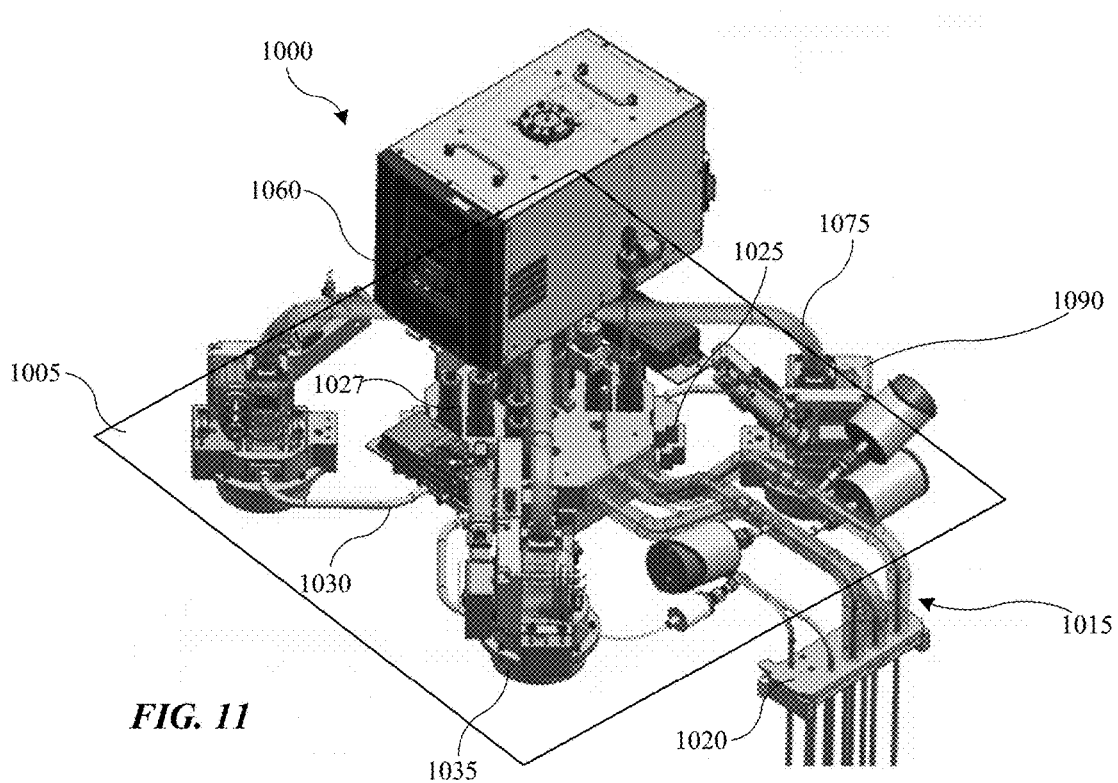
FIG. 11 shows a schematic isometric view of an exemplary processing system according to some embodiments of the present technology.

FIG. 11 shows a schematic isometric view of one embodiment of semiconductor processing system 1000 according to some embodiments of the present technology. The figure may include components of any of the systems illustrated and described previously, including system 600, and may also show further aspects of any of the previously described systems. It is to be understood that the illustration may also show exemplary components as would be seen on any quad section 109 described above.

Semiconductor processing system 1000 may include a lid plate 1005, which may be similar to second lid plate 510 previously described. For example, the lid plate 1005 may define a number of apertures, similar to apertures 512, which provide access to a number of processing chambers positioned beneath the lid plate. System 1000 may include a number of input weldments 1015 that extend upward from a number of gas source. The input weldments 1015 may pass through and/or otherwise be mounted on a feedthrough plate 1020 before coupling with gas lumens formed within a gas splitter 1010, which may be similar to gas splitter 610. The gas splitter 1010 may be interfaced with a number of orifice holders 1025. A number of valves 1027 may be coupled with the gas splitter 1010 to control gas mixing and/or flow to each processing chamber and/or through a divert channel. Gas splitter 1010 may be fluidly coupled with a number of output manifolds 1035 via an output weldment 1030. Each of the output manifolds 1035 may be positioned over one of the apertures formed in the lid plate 1005 and may be in fluid communication with one or more components of a lid stack and processing chamber positioned beneath each aperture.

A remote plasma unit 1060 may be supported atop the lid plate 1005 and may be fluidly coupled with each of the output manifolds 1030. For example, each output manifold 1030 may define a central aperture that may be fluidly coupled with the remote plasma unit 1060 using a manifold assembly. The remote plasma unit 1060 may be positioned above each of the output manifolds 1030.

As indicated above, the remote plasma unit 1060 may be fluidly coupled with each of the output manifolds 1030 using a manifold assembly. The remote plasma unit 1060 may provide precursors, plasma effluents, and/or purge gas to the output manifolds 1030 for subsequent delivery to the processing chambers for film deposition, chamber cleaning, and/or other processing operations. The manifold assembly may include a central manifold that may couple with a base of the remote plasma unit 1060 and split flow from a single gas input of the remote plasma unit 1060 to separate flows to each of the output manifolds 1030. Each separate gas flow of the central manifold may be coupled with a side manifold 1075 that defines at least a portion of a dedicated flow path to one of the output manifolds 1030. In some embodiments, an isolation valve 1090 may be positioned between each of the side manifolds 1075 and output manifolds 1030. The isolation valves 1090 may provide fluid control to each processing chamber, as well as prevent backstreaming of gases to the remote plasma unit 1060 and to prevent crosstalk between the various processing chambers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:
1. A semiconductor processing system, comprising:
a lid plate;
a gas splitter seated on the lid plate, the gas splitter comprising a top surface and a plurality of side surfaces, wherein the gas splitter defines:
a first gas inlet and a second gas inlet, with each of the first gas inlet and the second gas inlet extending through at least one of the plurality of side surfaces;
a plurality of first gas outlets, each first gas outlet extending through the top surface;
a plurality of second gas outlets, each second gas outlet extending through the top surface at a location proximate a respective one of the plurality of first gas outlets;
a plurality of first gas lumens that extend between and fluidly couple the first gas inlet with each of the plurality of first gas outlets;
a plurality of second gas lumens that extend between a fluidly couple the second gas inlet with each of the plurality of second gas outlets; and
a plurality of mixing channels, each mixing channel comprising a mixing outlet extending through one of the plurality of side surfaces and a mixing inlet extending through the top surface and being at a location proximate the first gas outlet and the second gas outlet;
a plurality of passive flow control devices, wherein:
each of the plurality of passive flow control devices is coupled with a respective one of the plurality of first gas lumens or a respective one of the plurality of second gas lumens; and
each of the plurality of passive flow control devices defines an orifice having a fixed diameter that is less than a diameter of the respective one of the plurality of first gas lumens or the respective one of the plurality of second gas lumens;
a plurality of first orifice holders, wherein:
each of the first orifice holders is coupled with a respective side surface of the gas splitter;
one of the plurality of passive flow control devices is seated between the gas splitter and each of the first orifice holders; and
each of the first orifice holders defines a first intermediate gas lumen that fluidly couples a first segment of a respective one of the first gas lumens with a second segment of the respective one of the first gas lumens;
a plurality of second orifice holders, wherein:
each of the second orifice holders is coupled with a respective side surface of the gas splitter;
one of the plurality of passive flow control devices is seated within each of the second orifice holders; and
each of the second orifice holders defines a second intermediate gas lumen that fluidly couples a first segment of a respective one of the second gas lumens with a second segment of the respective one of the second gas lumens;
a plurality of output manifolds seated on the lid plate; and
a plurality of output weldments, each output weldment fluidly coupling a respective one of the mixing outlets with a respective one of the output manifolds.

2. The semiconductor processing system of claim 1, wherein:
the gas splitter defines a divert lumen that is fluidly coupled with the first gas lumen and that directs gases away from a processing chamber through a divert outlet.

3. The semiconductor processing system of claim 1, further comprising:
a plurality of mixing valves, each of the mixing valves being coupled with a respective one of the first gas outlets, a respective one of the second gas outlets, and a respective one of the mixing inlets.

4. The semiconductor processing system of claim 1, wherein:
each of the plurality of passive flow control devices comprises a choke plate defining the orifice;
a first interface between each of the first intermediate fluid lumens and the respective one of the first gas lumens comprises one of the choke plates;
the orifice of each choke plate has a diameter that is less than a diameter of the first intermediate fluid lumen;
a second interface between each of the second intermediate fluid lumens and the respective one of the second gas lumens comprises one of the choke plates; and
the orifice of each choke plate has a diameter that is less than a diameter of the second intermediate fluid lumen.

5. The semiconductor processing system of claim 1, further comprising:
a plurality of input weldments that fluidly couple a plurality of gas sources with the gas inputs of the gas splitter.

6. The semiconductor processing system of claim 1, wherein:
the gas splitter comprises a heat source.

7. The semiconductor processing system of claim 1, further comprising:
a remote plasma unit supported above the gas splitter, the remote plasma unit being fluidly coupled with each of the plurality of output manifolds.

8. The semiconductor processing system of claim 7, further comprising:
a center manifold coupled with an outlet of the remote plasma unit; and
a plurality of side manifolds that are each fluidly coupled with one of a plurality of outlet ports of the center manifold, wherein each of the plurality of side manifolds defines a gas lumen that is fluidly coupled with one of the plurality of output manifolds.

9. The semiconductor processing system of claim 1, further comprising:
a plurality of processing chambers positioned below the lid plate, wherein each processing chamber defines a processing region that is fluidly coupled with one of the plurality of output manifolds.

10. A semiconductor processing system, comprising:
a gas splitter comprising a top surface and a plurality of side surfaces, wherein the gas splitter defines:
a first gas inlet and a second gas inlet, with each of the first gas inlet and the second gas inlet extending through at least one of the plurality of side surfaces;
a plurality of first gas outlets, each first gas outlet extending through the top surface;
a plurality of second gas outlets, each second gas outlet extending through the top surface at a location proximate a respective one of the plurality of first gas outlets;
a plurality of first gas lumens that extend between and fluidly couple the first gas inlet with each of the plurality of first gas outlets;
a plurality of second gas lumens that extend between a fluidly couple the second gas inlet with each of the plurality of second gas outlets; and
a plurality of mixing channels, each mixing channel comprising a mixing outlet extending through one of the plurality of side surfaces and a mixing inlet extending through the top surface and being at a location proximate the first gas outlet and the second gas outlet;
a plurality of passive flow control devices, wherein:
each of the plurality of passive flow control devices is coupled with a respective one of the plurality of first gas lumens or a respective one of the plurality of second gas lumens; and
each of the plurality of passive flow control devices defines an orifice having a fixed diameter that is less than a diameter of the respective one of the plurality of first gas lumens or the respective one of the plurality of second gas lumens;
a plurality of first orifice holders, wherein:
each of the first orifice holders is coupled with a respective side surface of the gas splitter;
one of the plurality of passive flow control devices is seated within each of the first orifice holders; and
each of the first orifice holders defines a first intermediate gas lumen that fluidly couples a first segment of a respective one of the first gas lumens with a second segment of the respective one of the first gas lumens; and
a plurality of second orifice holders, wherein:
each of the second orifice holders is coupled with a respective side surface of the gas splitter;
one of the plurality of passive flow control devices is seated within each of the second orifice holders; and
each of the second orifice holders defines a second intermediate gas lumen that fluidly couples a first segment of a respective one of the second gas lumens with a second segment of the respective one of the second gas lumens.

11. The semiconductor processing system of claim 10, further comprising:
a plurality of output manifolds; and
a plurality of output weldments, each output weldment fluidly coupling a mixing outlet of one of the gas lumens with a respective one of the output manifolds.

12. The semiconductor processing system of claim 11, further comprising:
a remote plasma unit supported above the gas splitter, the remote plasma unit being fluidly coupled with each of the plurality of output manifolds.

13. The semiconductor processing system of claim 12, further comprising:
a plurality of isolation valves, wherein each of the plurality of isolation valves is fluidly coupled between the remote plasma unit and one of the plurality of output manifolds.

14. The semiconductor processing system of claim 11, further comprising:
a lid plate that supports each of the plurality of output manifolds; and
a plurality of processing chambers positioned below the lid plate, wherein each processing chamber defines a processing region that is fluidly coupled with one of the plurality of output manifolds.

15. The semiconductor processing system of claim 10, further comprising:
a first input weldment that fluidly couples a first gas source with the first gas inlet of the gas splitter; and
a second input weldment that fluidly couples a second gas source with the second gas inlet of the gas splitter.

16. The semiconductor processing system of claim 10, further comprising:
a plurality of mixing valves, each of the mixing valves being coupled with a respective one of the first gas outlets, a respective one of the second gas outlets, and a respective one of the mixing inlets.

17. The semiconductor processing system of claim 10, wherein:
the gas splitter defines a divert lumen that is fluidly coupled with the first gas lumen and that directs gases away from a processing chamber through a divert outlet.

18. The semiconductor processing system of claim 10, further comprising:
a
each of the plurality of passive flow control devices comprises a choke plate defining the orifice;
a first interface between each of the first intermediate fluid lumens and the respective one of the first gas lumens comprises one of the choke plates;
the orifice of each choke plate has a diameter that is less than a diameter of the first intermediate fluid lumen; and
a second interface between each of the second intermediate fluid lumens and the respective one of the second gas lumens comprises one of the choke plates; and
the orifice of each choke plate has a diameter that is less than a diameter of the second intermediate fluid lumen.

19. A semiconductor processing system, comprising:
a plurality of processing chambers, each processing chamber defining a processing region;
a lid plate positioned above the plurality of processing chambers;
a plurality of output manifolds seated on the lid plate, each of the plurality of output manifolds being in fluid communication with the processing region of one of the plurality of processing chambers;
a gas splitter seated on the lid plate, the gas splitter comprising a top surface and a plurality of side surfaces, wherein the gas splitter defines:
a first gas inlet and a second gas inlet, with each of the first gas inlet and the second gas inlet extending through at least one of the plurality of side surfaces;
a plurality of first gas outlets, each first gas outlet extending through the top surface;
a plurality of second gas outlets, each second gas outlet extending through the top surface at a location proximate a respective one of the plurality of first gas outlets;
a plurality of first gas lumens that extend between and fluidly couple the first gas inlet with each of the plurality of first gas outlets;
a plurality of second gas lumens that extend between a fluidly couple the second gas inlet with each of the plurality of second gas outlets;
a plurality of mixing channels, each mixing channel comprising a mixing outlet extending through one of the plurality of side surfaces and a mixing inlet extending through the top surface and being at a location proximate the first gas outlet and the second gas outlet;
a plurality of passive flow control devices, wherein:
each of the plurality of passive flow control devices is coupled with a respective one of the plurality of first gas lumens or a respective one of the plurality of second gas lumens; and
each of the plurality of passive flow control devices defines an orifice having a fixed diameter that is less than a diameter of the respective one of the plurality of first gas lumens or the respective one of the plurality of second gas lumens;
a plurality of first orifice holders, wherein:
each of the first orifice holders is coupled with a respective side surface of the gas splitter;
one of the plurality of passive flow control devices is seated within each of the first orifice holders; and
each of the first orifice holders defines a first intermediate gas lumen that fluidly couples a first segment of a respective one of the first gas lumens with a second segment of the respective one of the first gas lumens; and
a plurality of second orifice holders, wherein:
each of the second orifice holders is coupled with a respective side surface of the gas splitter;
one of the plurality of passive flow control devices is seated within each of the second orifice holders; and
each of the second orifice holders defines a second intermediate gas lumen that fluidly couples a first segment of a respective one of the second gas lumens with a second segment of the respective one of the second gas lumens; and
a plurality of weldments, each weldment fluidly coupling a respective one of the mixing outlets with a respective one of the output manifolds.

* * * * *